United States Patent [19]
Ye et al.

[11] Patent Number: 6,080,529
[45] Date of Patent: *Jun. 27, 2000

[54] METHOD OF ETCHING PATTERNED LAYERS USEFUL AS MASKING DURING SUBSEQUENT ETCHING OR FOR DAMASCENE STRUCTURES

[75] Inventors: Yan Ye, Saratoga; Pavel Ionov, Sunnyvale; Allen Zhao, Mountain View; Peter Chang-Lin Hsieh, Sunnyvale; Diana Xiaobing Ma, Saratoga; Chun Yan, Santa Clara; Jie Yuan, San Jose, all of Calif.

[73] Assignee: Applied Materials, Inc., Santa Clara, Calif.

[ * ] Notice: This patent is subject to a terminal disclaimer.

[21] Appl. No.: 09/174,763

[22] Filed: Oct. 19, 1998

Related U.S. Application Data

[63] Continuation-in-part of application No. 08/991,219, Dec. 12, 1997.

[51] Int. Cl.[7] ................................................ G03C 5/58
[52] U.S. Cl. ........................... 430/318; 430/313; 430/311
[58] Field of Search ..................................... 430/318, 313, 430/311, 323, 314, 330, 322, 299, 310

[56] References Cited

U.S. PATENT DOCUMENTS

| | | | |
|---|---|---|---|
| 4,256,534 | 3/1981 | Levinstein et al. | 156/643 |
| 4,440,804 | 4/1984 | Milgram | 427/91 |
| 4,444,618 | 4/1984 | Saia et al. | 156/643 |

(List continued on next page.)

FOREIGN PATENT DOCUMENTS

| | | | |
|---|---|---|---|
| 0407169 | 1/1991 | European Pat. Off. | H01J 37/32 |
| 0531232 | 3/1993 | European Pat. Off. | H01L 21/20 |
| 2091940 | 3/1899 | Japan | H01L 21/3205 |
| 1234578 | 9/1989 | Japan | C23F 4/00 |
| 2207418 | 8/1990 | Japan | H01B 13/00 |
| 2295117 | 12/1990 | Japan | C23F 4/00 |
| 04099290 | 3/1992 | Japan | C23F 4/00 |
| 4173988 | 6/1992 | Japan | C23F 4/00 |
| 4187787 | 7/1992 | Japan | C23F 4/00 |

(List continued on next page.)

OTHER PUBLICATIONS

S. DeOrnellas et al., "Plasma Etch of Ferroelectric Capacitors in FeRAMS and DRAMS", *Semiconductor International*, pp. 103–108 (Sep. 1997).

(List continued on next page.)

*Primary Examiner*—Janet Baxter
*Assistant Examiner*—Yvette M. Clarke
*Attorney, Agent, or Firm*—Shirley L. Church

[57] ABSTRACT

A first embodiment of the present invention pertains to a method of patterning a semiconductor device conductive feature while permitting easy removal of any residual masking layer which remains after completion of the etching process. A multi-layered masking structure is used which includes a layer of high-temperature organic-based masking material overlaid by either a patterned layer of inorganic masking material or by a layer of patterned high-temperature imageable organic masking material. The inorganic masking material is used to transfer a pattern to the high-temperature organic-based masking material and is then removed. The high-temperature organic-based masking material is used to transfer the pattern and then may be removed if desired. This method is also useful in the pattern etching of aluminum, even though aluminum can be etched at lower temperatures. A second embodiment of the present invention pertains to a specialized etch chemistry useful in the patterning of organic polymeric layers such as low k dielectrics, or other organic polymeric interfacial layers. This etch chemistry is useful for mask opening during the etch of a conductive layer or is useful in etching damascene structures where a metal fill layer is applied over the surface of a patterned organic-based dielectric layer. The etch chemistry provides for the use of etchant plasma species which minimize oxygen, fluorine, chlorine, and bromine content.

9 Claims, 6 Drawing Sheets

6,080,529

U.S. PATENT DOCUMENTS

| | | | | |
|---|---|---|---|---|
| 4,447,824 | 5/1984 | Logan et al. | | 357/71 |
| 4,474,642 | 10/1984 | Nakane et al. | | 156/643 |
| 4,519,872 | 5/1985 | Anderson, Jr. et al. | | 156/443 |
| 4,557,796 | 12/1985 | Druschke et al. | | 156/643 |
| 4,753,709 | 6/1988 | Welch et al. | | 156/643 |
| 4,832,788 | 5/1989 | Nemiroff et al. | | 156/643 |
| 4,863,557 | 9/1989 | Kokaku et al. | | 156/643 |
| 4,966,865 | 10/1990 | Welch et al. | | 437/192 |
| 5,053,105 | 10/1991 | Fox, III | | 156/643 |
| 5,067,002 | 11/1991 | Zdebel et al. | | 358/59 |
| 5,110,712 | 5/1992 | Kessler et al. | | 430/312 |
| 5,141,817 | 8/1992 | Babich et al. | | 428/447 |
| 5,183,972 | 2/1993 | Duane et al. | | 174/251 |
| 5,186,718 | 2/1993 | Tepman et al. | | 29/25.01 |
| 5,240,559 | 8/1993 | Ishida | | 456/666 |
| 5,277,750 | 1/1994 | Frank | | 156/643 |
| 5,286,344 | 2/1994 | Blalock et al. | | 156/657 |
| 5,298,112 | 3/1994 | Hayasaka et al. | | 156/643 |
| 5,326,431 | 7/1994 | Kadomura | | 156/659.1 |
| 5,346,586 | 9/1994 | Keller | | 156/656 |
| 5,356,511 | 10/1994 | Hoessel et al. | | 156/629 |
| 5,387,556 | 2/1995 | Xiaobing et al. | | 437/228 |
| 5,411,631 | 5/1995 | Hori et al. | | 216/72 |
| 5,445,710 | 8/1995 | Hori et al. | | 156/643.1 |
| 5,476,753 | 12/1995 | Hashimoto et al. | | 430/296 |
| 5,544,191 | 8/1996 | Ohzu et al. | | 372/56 |
| 5,550,405 | 8/1996 | Cheung et al. | | 257/642 |
| 5,559,056 | 9/1996 | Weiler | | 437/195 |
| 5,578,166 | 11/1996 | Hirota | | 156/643.1 |
| 5,880,018 | 3/1999 | Broeck et al. | | 438/619 |

FOREIGN PATENT DOCUMENTS

| | | | |
|---|---|---|---|
| 4199821 | 7/1992 | Japan | H01L 21/302 |
| 4199824 | 7/1992 | Japan | H01L 21/302 |
| 4350939 | 12/1992 | Japan . | |
| 7161687 | 6/1995 | Japan | H01L 21/3065 |
| 7201856 | 8/1995 | Japan | H01L 21/3205 |
| WO 96/12297 | 4/1996 | WIPO | H01L 21/768 |

OTHER PUBLICATIONS

Y. Igarishi et al. ***, "Dry Etching Technique for Subquarter–Micron Copper Interconnects", *J. Electrochem. Soc.*, vol. 142, No. 3, pp. L36–L37 (Mar. 1995).

H. Miyazaki et al., "Copper dry etching using $Cl_2$ gas as a single reactant and its application to ULSI", Semi Technology Symposium (Japan), Session 5, pp. 41–43 (Dec. 1996).

C. Steinbrüchel*, "Patterning of copper for multilevel metallization: reactive ion etching and chemical–mechanical polishing," *Applied Surface Science* 91 (1995) p. 139–146.

T. W. Weidman et al.*, "All Dry Lithography: Applications of Plasma Polymerized Methylsilane as a Single Layer Resist and Silicon Dioxide Precursor", *J. Photopolym. Sci. Tech.*, vol. 8, No. 4, pp. 679–686 (1995).

Y. Ye et al.*, "0.35–Micron and Sub-0.35 Micron Metal Stack Etch in a DPS Chamber—DPS chamber and process Characterization", *Electrochemical Society Proceedings*, vol. 96–12, pp. 22–233 (1996).

U.S. application No. 08/891,410, Ye et al., filed Jul. 9, 1997.

U.S. application No. 08/911,878, Ye et al., filed Au. 13, 1997.

U.S. application No. 09/130,893, Ye et al., filed Aug. 7, 1998.

O. Joubert et al., "Application of Plasma Polymerized Methylsilane in all dry resist process for 193 and 248 nm Lithography", *Microelectric Engineering*, vol. 30, pp. 275–278 (1996).

International Search Report mailed Apr. 12, 1999 in PCT Application No. PCT/US98/25699, filed Dec. 4, 1997.

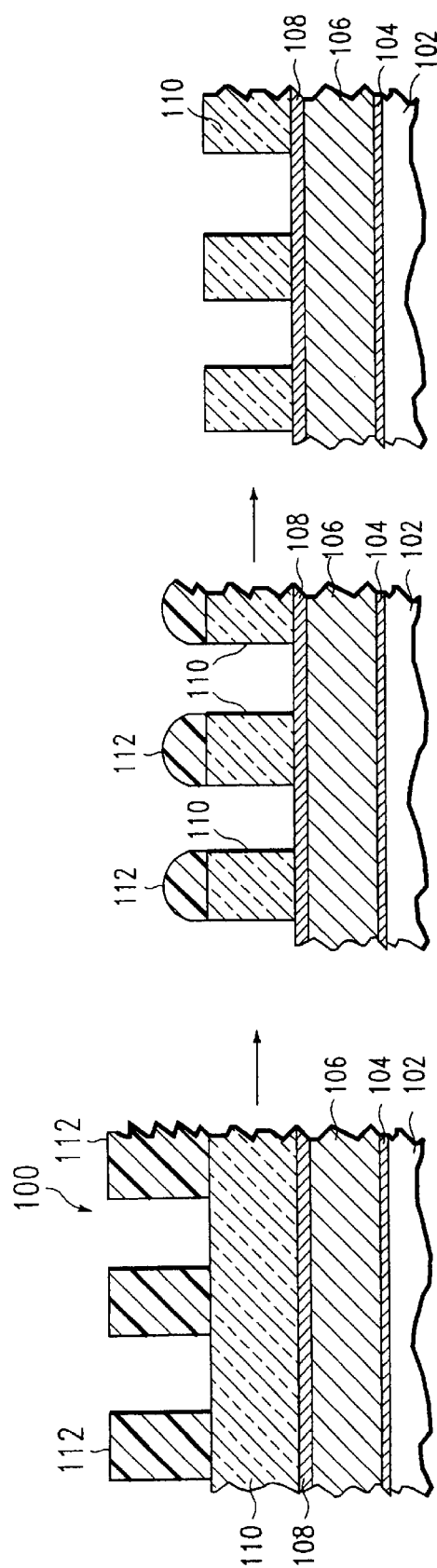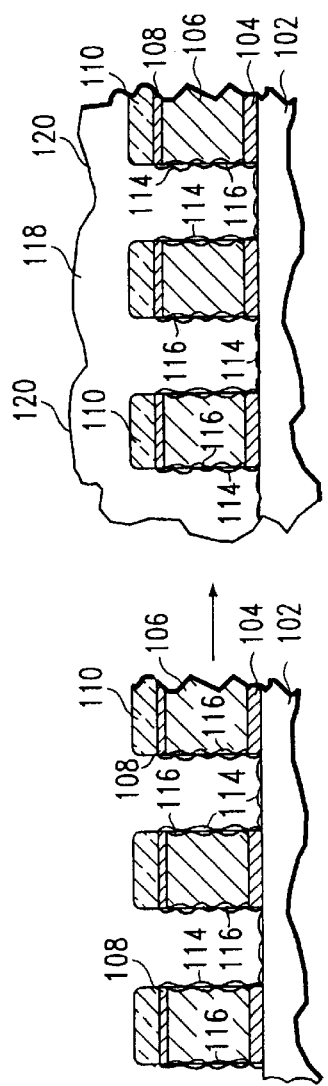

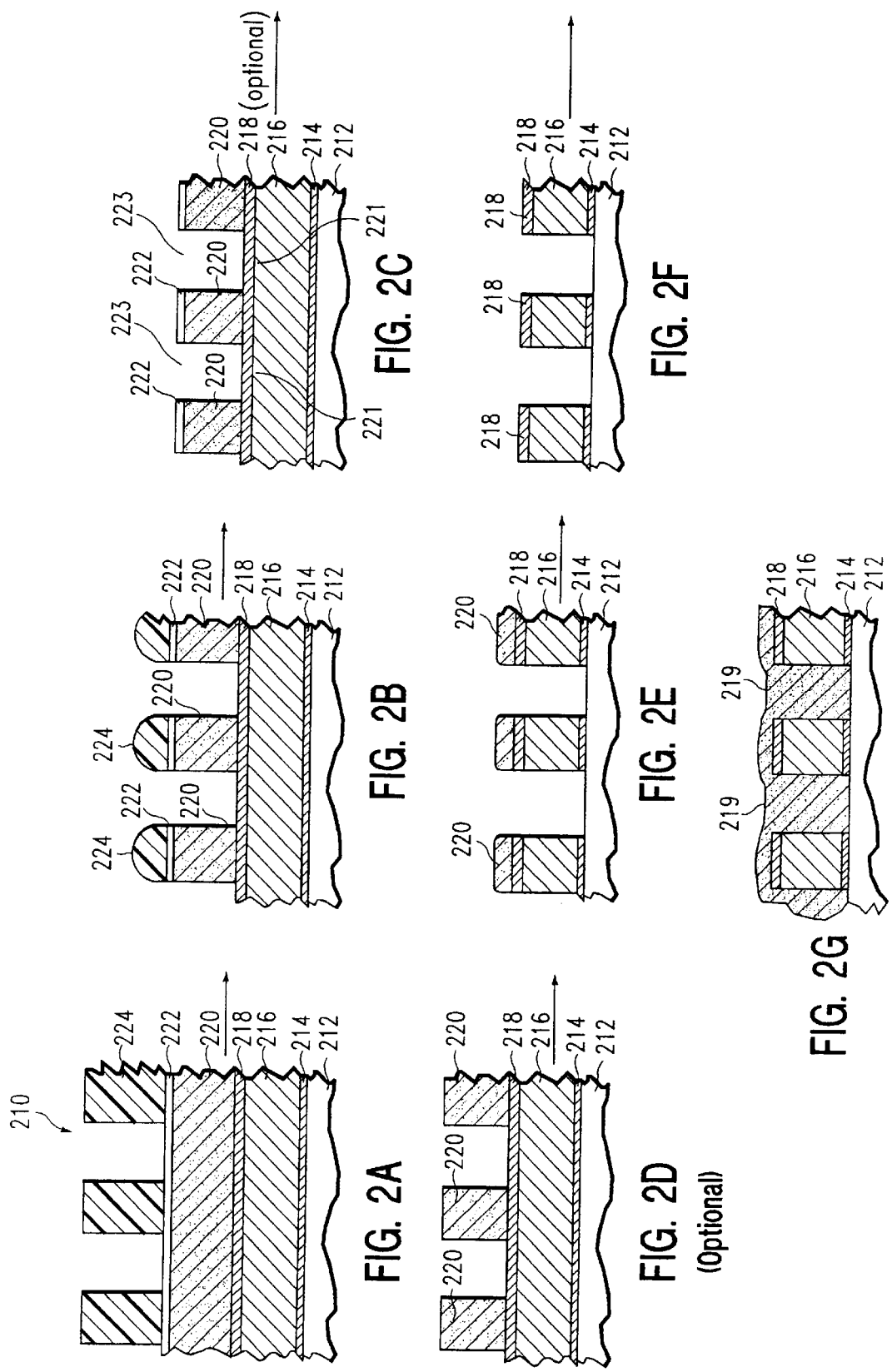

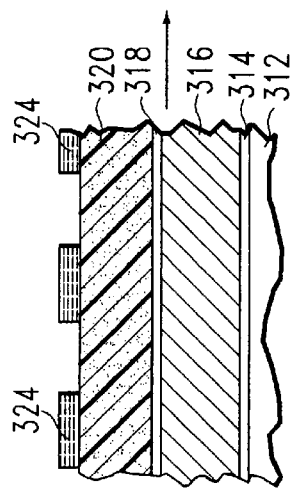
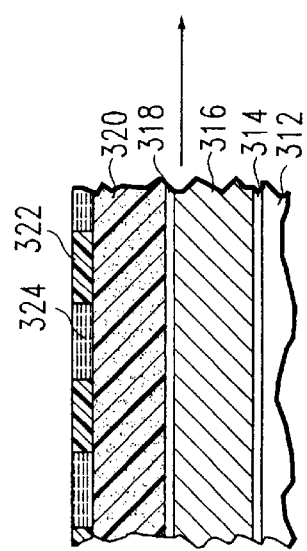
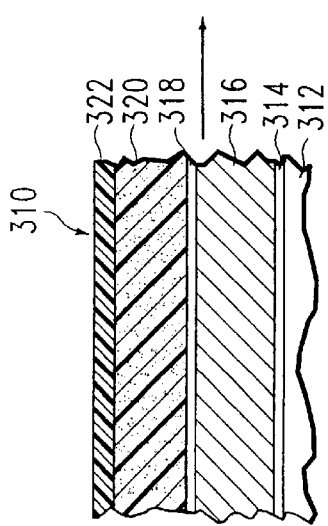
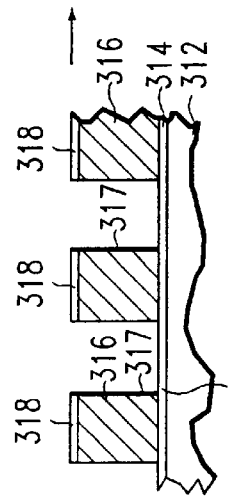
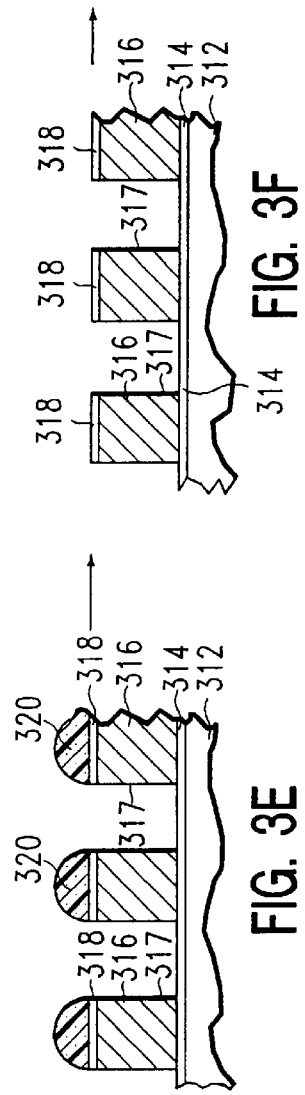
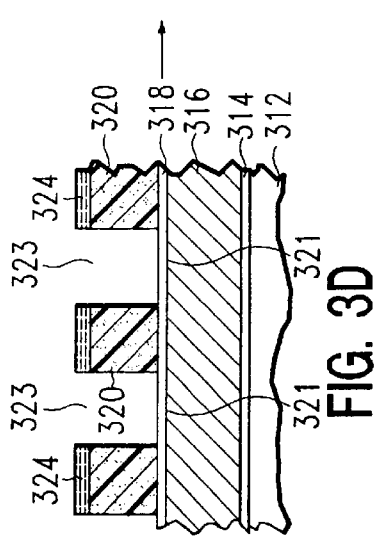
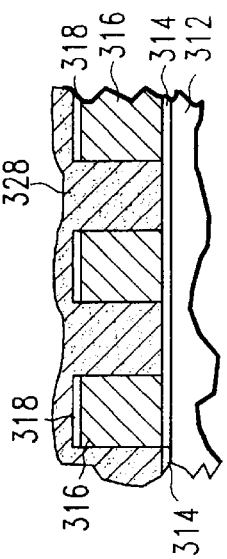

METHOD OF ETCHING PATTERNED LAYERS USEFUL AS MASKING DURING SUBSEQUENT ETCHING OR FOR DAMASCENE STRUCTURES

The present application in a continuation-in-part of application Ser. No. 08/991,219, filed on Dec. 12, 1997, allowed, and titled: "Method For High Temperature Etching Of Patterned Layers Using An Organic Mask Stack", which application is currently pending.

BACKGROUND OF THE INVENTION

1. Field of the Invention

The present invention pertains to a method for etching of patterned layers. The method is useful in high temperature etch processes where the layers are high temperature masking materials or are metal-comprising layers such as copper, platinum, iridium, and barium strontium titanate. The method is also useful in lower temperature etch processes in which organic polymeric layers, such as low k dielectrics, are etched to form damascene process structures. The present method may also be used for lower temperature etching of metal layers such as aluminum or tungsten, when the pattern geometry is small (less than about 0.25 µm) and etch selectivity is a problem.

2. Brief Description of the Background Art

In the field of semiconductor device fabrication, particularly with the continuing trend toward smaller device feature sizes, the etch processes which are used to construct conductive features such a metal interconnects and contacts have become particularly critical. The new devices, having feature sizes in the range of about 0.25 µm and smaller, place an emphasis on both the precise profile achievable during pattern etching and on the avoidance of any residue remaining after etch which causes problems during subsequent processing or problems in long term device function.

We previously worked to develop a plasma etching system which reduces and avoids the formation of residue on the surface of a copper layer during pattern etching of the copper. The etching systems useful in etching of the conductive material are described in copending application Ser. Nos. 08/891,410, filed Jul. 9, 1997, and 08/911,878, filed Aug. 13, 1997, both of which are hereby incorporated by reference and both of which are assigned to the assignee of the present application.

We have simultaneously been working to develop an etching process which permits the development of patterning masks which can transfer a desired pattern to adjacent layers in a manner which reduces or avoids the formation of mask residue on the etched structure. Further, we have worked to develop an etching process useful in etching organic polymeric materials for damascene processes, where the conductive layer is applied over the patterned surface of a dielectric layer to form desired conductive interconnect and contact structures.

FIGS. 1A–1E show a schematic cross-sectional view of a typical plasma etch stack for etching a metal-comprising layer at temperatures in excess of about 150° C. as it progresses through a series of steps including the etching of both dielectric and conductive layers. This etch stack is of the kind known and used prior to the present invention. FIG. 1A shows a complete etch stack, including, from bottom to top, Substrate 102, which is typically a dielectric layer overlying a semiconductor substrate (such as a silicon wafer substrate) or which may be the semiconductor material itself, depending on the location on a given device surface. Barrier layer 104, which prevents the diffusion and/or migration of material between conductive layer 106 and substrate 102; conductive layer 106, which is typically aluminum or copper, but might be tungsten, platinum, or iridium, for example. Anti-reflective-coating (ARC) layer 108, which is typically a metal-containing compound and which enables better imaging of an overlying patterning layer. Pattern masking layer 110, which is typically a layer of silicon dioxide or similar inorganic material which can withstand the high temperatures encountered during etching of conductive layer 106, and which can be patterned and used as a mask during such etching. And, photoresist layer 112 which is typically an organic-based material which is stable at low temperatures and which is used to pattern masking layer 110, which is stable at higher temperatures. In FIG. 1A, photoresist layer 112 has already been patterned to provide the feature shape desired to be transferred to pattern masking layer 110.

FIG. 1B shows the stack described in FIG. 1A, where the pattern in photoresist layer 112 has been transferred to pattern masking layer 110, using a standard plasma etching technique. When masking layer 110 comprises a silicon-containing material, such as silicon dioxide, the etch plasma typically comprises a fluorine-generating species. Preferably the plasma selectivity is for the silicon dioxide over the photoresist material.

FIG. 1C shows the next step in the process of etching conductive layer 106, where the photoresist layer 112 has been stripped from the surface of pattern masking layer 110. This stripping procedure may be a wet chemical removal or may be a plasma etch which is selective for the photoresist layer 112 over the pattern masking layer 110. Stripping of photoresist layer 112 is carried out for two reasons. The organic-based photoresist materials typically used for layer 112 would melt or become distorted in shape at the temperatures commonly reached during the etching of conductive layer 106. This could lead to distortion of the pattern which is transferred to conductive layer 106. In addition, polymeric species generated due to the exposure of the surface of photoresist layer 112 to the etchant plasma tend to contaminate adjacent surfaces during the etching of conductive layer 106, thereby decreasing the etch rate of conductive layer 106.

The procedure of using a photoresist material to pattern an underlying silicon oxide patterning layer is described in U.S. Pat. No. 5,067,002 to Zdebel et al., issued Nov. 19, 1991. Zdebel et al. mention the need to remove the photoresist material prior to etching of underlying layers, to avoid contamination of underlying surfaces with the photoresist material during etching of such underlying layers. David Keller describes the use of an ozone plasma for the purpose of dry etch removal of a photoresist mask from the surface of an oxide hard mask in U.S. Pat. No. 5,346,586, issued Sep. 13, 1994. Mr. Keller also mentions that it is easier to etch selectively to a gate oxide when there is no photoresist present during a polysilicon gate oxide etch step.

FIG. 1D shows the next step in the etching process, where the desired pattern has been transferred through ARC layer 108, conductive layer 106, and barrier layer 104. Typically all of these layers are metal comprising layers, and a halogen containing plasma can be used to etch the pattern through all three layers. At this point, the problem is the removal of the residual silicon dioxide hard masking material and the removal of residue deposits of the silicon dioxide masking material from adjacent surfaces. The residual hard masking material is present as residual masking layer 110, and the residue deposits as 114 on the surface of the patterned conductive layer 106 and the surface of substrate 102.

In the case of the deposit 114 on the surface of patterned conductive layer 106, deposit 114 can trap residual chemical etch reactants under deposit 114 and against the surface of patterned conductive layer 106, leading to subsequent corrosion of conductive layer 106. That corrosion is shown on FIG. 1D as 116.

In addition, when substrate 102 is a low dielectric constant material, for purposes of reducing electrical interconnect delays, residual masking layer 110 which remains after pattern etching through layers 108, 106, and 104 (as shown in FIG. 1D) can deteriorate device performance or cause difficulties in future processing steps (particularly during contact via etch). This makes it important to remove any residual masking layer 110 from the surface of ARC layer 108.

Further, when a dielectric layer 118 is applied over the surface of the patterned conductive layer 106, as shown in FIG. 1E, if residual masking layer 110 is not removed, a non-planar surface 120 is produced. A non-planar surface creates a number of problems in construction of a multi-conductive-layered device, where additional patterned conductive layers (not shown) are constructed over the surface 120 of dielectric layer 118.

With the above considerations in mind, we wanted to develop a patterning system, including a multi-layered structure and a method for its use which would provide for the easy removal of residual masking layer material after completion of the patterning process. During the development of the etching method we discovered a particular etch chemistry which is equally applicable to etching organic dielectric layers for formation of contact structures in conventional metallization processes, and in the formation of damascene and dual damascene structures.

SUMMARY OF THE INVENTION

A first embodiment of the present invention pertains to a method of patterning metal-comprising semiconductor device features and conductive features in general, wherein the method provides for the easy removal of any residual masking layer which remains after completion of a pattern etching process. The method provides for a multi-layered masking structure which includes a layer of high-temperature organic-based masking material overlaid by either a layer of a high-temperature inorganic masking material (such as silicon oxide, silicon nitride, or silicon carbide) which can be patterned to provide an inorganic hard mask, or by a layer of high-temperature imageable organic masking material, such as PPMS, which can be processed and patterned to provide a hard mask. The hard masking material is used to transfer a pattern to the high-temperature organic-based masking material, and then the hard masking material is removed. The high-temperature organic-based (carbon-based) masking material is used to transfer the pattern to an underlying semiconductor device feature. The high-temperature organic-based masking material can be removed from the surface of the patterned semiconductor device feature in a manner which reduces or avoids contamination of the patterned feature surface.

In accordance with the present invention, we have developed two patterning systems which enable the patterning of underlying layers at relatively high temperatures, ranging between about 150° C. and about 500° C., while providing easy removal of any residual masking layer remaining after the patterning process.

The first patterning system uses a multi-layered masking structure which includes a layer of high-temperature organic-based masking material overlaid by a layer of a high-temperature inorganic masking material, which is further overlaid by a layer of a patterning photoresist.

The patterning method is as follows.

a) The layer of photoresist material is imaged and developed into a pattern using techniques known in the art, to produce a patterned mask which can be used to transfer the desired pattern throughout the multi-layered masking structure and eventually through at least one device feature layer as well.

b) The patterned photoresist is used to transfer the pattern through i) a layer of high-temperature inorganic masking material; and ii) a layer of high-temperature organic-based masking material.

Preferably the pattern transfer through the layer of high-temperature organic-based masking material is via an anisotropic plasma etch technique so that this material is not undercut by the pattern transfer process.

c) Residual photoresist which remains after pattern transfer is then removed from the multilayered structure by plasma etch, using the high-temperature inorganic masking layer as an etch stop. The photoresist removal is accomplished using an anisotropic etch process which typically comprises an oxygen-based plasma etch. The anisotropic stripping of the photoresist prevents or at least substantially reduces any etching of the high-temperature organic-based masking material during photoresist removal.

d) Optionally, the layer of high temperature inorganic masking material may be removed at this time using a plasma etch technique or a wet etch technique designed to minimize any etching of the organic-based masking material. Preferably, the high temperature inorganic masking material is of a thickness such that it will be automatically removed during etching of a feature layer (step e).

(e) The pattern is then transferred from the high-temperature organic-based masking layer through at least one feature layer underlying the high-temperature organic-based masking material.

f) Any high-temperature organic-based masking material remaining after feature layer patterning is then easily removed using a plasma etch technique. When the etched feature layer would be corroded or oxidized by an oxygen-based plasma, a hydrogen/nitrogen-based plasma etch technique is recommended. The removal of organic-based masking material may be by a wet stripping technique using a solvent known in the art to be advantageous in the passivation of the surface of the patterned feature layer.

Since there is no residual photoresist material remaining from step a) present during etching of the feature layer, there is no layer which is likely to melt or distort in shape during transfer of the pattern from the high-temperature organic-based masking material to an underlying device feature layer.

Since the high-temperature organic-based masking layer is easily removed, there need be no residual masking layer present in the device structure to affect device performance or to cause difficulties during subsequent via etch. Preferably, the high-temperature organic-based masking layer is formed from α-C and α-FC films deposited using CVD techniques. Examples of starting materials used to form such films include $CH_4$, $C_2H_2$, $CF_4$, $C_2F_6$, $C_4F_8$, $NF_3$, and combinations thereof, there are, of course, numbers of other carbon-containing precursor materials which can also be used. The starting materials which contain less (or no) fluorine are preferred.

The second patterning system is different from the first patterning system in that it uses a high-temperature pattern-imaging layer rather than a more standard photoresist imaging layer. The high-temperature pattern-imaging layer is stable at temperatures ranging from about 150° C. to about 500° C., compared with photoresist materials which are generally stable at about 150° C. or lower. Preferably the high-temperature pattern-imaging layer is a plasma-polymerized material; more preferably, the pattern-imaging layer is an organo-silicon compound, such as plasma polymerized methyl silane (PPMS), which may be imaged by deep UV and which is plasma-developable. However, the high-temperature imaging layer may also be formed from a different silane-based starting material such as a TEOS-based (tetra-ethyl-ortho-silicate-based) chemistry, and one skilled in the art may select from other similar materials known in the art.

The patterning method is as follows.

a) A layer of high-temperature imageable material is imaged and developed into a pattern using techniques known in the art, to produce a patterned mask which can be used to transfer the desired pattern through the high-temperature organic-based masking material and eventually through at least one device feature layer.

b) After patterning of the high-temperature imageable material, the pattern is transferred through the underlying layer of high-temperature organic-based masking material. Preferably the pattern is transferred via an anisotropic etch technique, whereby the high-temperature organic-based masking material is not undercut by the pattern transfer step.

c) The pattern is then transferred from the multi-layered structure formed in steps a) and b) through at least one feature layer underlying the high-temperature organic-based masking material. Preferably the pattern is transferred using an anisotropic etching technique so that any high-temperature imageable material which might remain from step b) is removed during this pattern transfer step. In addition, the use of an anisotropic etching technique reduces or avoids the possibility of undercutting the high-temperature organic-based material layer during the pattern transfer to the underlying device feature layer.

d) Any residual high-temperature organic-based masking material which remains after pattern transfer is then easily removed using a plasma etch technique. When the etched feature layer would be corroded or oxidized by an oxygen-based plasma, a hydrogen-based plasma etch technique is recommended.

Since there is no low temperature residual photoresist material used during this process, there is no layer which is likely to melt or distort in shape during transfer of the pattern from the high-temperature organic masking material to an underlying device feature layer.

As previously mentioned, the high-temperature imageable material is preferably a silane-based starting material such as plasma polymerized methyl silane (PPMS), or a TEOS-based (tetra-ethyl-ortho-silicate-based) material, and one skilled in the art may select from other similar materials known in the art.

The high-temperature organic-based masking material is preferably chosen from materials which can be easily removed by plasma etch techniques or by using a solvent known in the art to be advantageous in the passivation of the surface of the patterned feature layer. Examples of such materials are provided above with reference to the first patterning system.

When the device feature layer which is to be patterned includes a copper layer, that copper layer is preferably pattern etched using either an enhanced physical bombardment technique or a plasma etching technique which generates sufficient hydrogen to protect the copper surface during patterning.

The above-described method is also useful in the pattern etching of aluminum or tungsten, even though these metals can be etched at lower temperatures, typically below about 200° C. (because the etch reaction byproducts are more volatile). When the feature size of an aluminum-comprising structure is about 0.25 μm and smaller, use of a hard mask patterning layer, such as silicon dioxide, silicon nitride, or silicon carbide provides a sufficiently long mask lifetime during etching of an underlying aluminum-comprising layer. Further, since the selectivity toward aluminum is better when such a hard mask patterning layer is used rather than a typical organic-based photoresist, the masking layer thickness can be less, the aspect ratio is lower, and the possibility of shading damage to the device structure is reduced. The present method makes removal of the hard masking material possible without damage to the substrate, which is advantageous in subsequent processing.

A second embodiment of the present invention pertains to a specialized etch chemistry useful in the patterning of organic polymeric layers such as low dielectric constant (low k dielectric) materials and other organic polymeric interfacial layers. This etch chemistry is especially useful in a multilayered substrate of the kind described above. It is also useful in etching damascene structures where a metal fill layer is applied over the surface of a patterned organic-based dielectric layer.

In particular, when the organic, polymeric material being etched serves as a patterning mask for etch of a copper film, or when the organic, polymeric material being etched is part of a damascene structure which is to be filled with copper, the etch chemistry provides for use of etchant plasma species where the oxygen, fluorine, chlorine, and bromine content is minimized. Preferably, essentially none of the plasma source gas material furnishes reactive species comprising oxygen, fluorine, chlorine, or bromine. When a patterning mask for etch of a copper film is prepared, should these etchant species contact the copper film, the film is oxidized or otherwise corroded. In addition, etchant species which contain oxygen, fluorine, chlorine or bromine leave deposits of etch byproduct on etched contact via and damascene structure surfaces which may cause oxidation and corrosion of copper depositions made over such surfaces. Further, during etching of some organic-comprising materials, oxygen and fluorine etchant species tend to have a detrimental effect on a typical contact via or trench etch profile.

When the conductive material is aluminum, tungsten, platinum, or iridium, rather than copper, the presence of oxygen is more acceptable during etch of the organic polymeric material. When the metal fill layer is tungsten, platinum, or iridium, the effect of the presence of fluorine, chlorine and bromine depends on the particular material used, as is known to one skilled in the art. However, even when the conductive material is aluminum, tungsten, platinum or iridium, oxygen-comprising or halogen etchant species are typically used as additives to increase etch rate or improve etch profile, or to control residue on an etch surface, but are not the principal etchant species for etching of the organic, polymeric material.

The preferred etch plasma of the present invention is a hydrogen/nitrogen-based plasma, wherein the principal etchant species is hydrogen, or nitrogen, or a combination thereof. In addition, as described above, depending on the materials used in the device fabrication, the concentration of at least one etchant species such as oxygen, chlorine, fluorine, and bromine is preferably minimized. To provide a hydrogen/nitrogen-based plasma, the plasma etchant species comprise principally hydrogen, or principally nitrogen, or principally a mixture thereof. To provide these species, the plasma source gas comprises at least one of the materials selected from the group consisting of hydrogen, nitrogen, ammonia and compounds thereof, hydrazine and compounds thereof, hydroazoic acid, and combinations thereof. When the conductive material to be used in the device is not copper, but is instead aluminum, tungsten, platinum, or iridium, the plasma source gas may comprise hydroxylamine or a compound thereof. The most preferred plasma source gas comprises ammonia; or hydrogen and nitrogen; or a combination of ammonia with hydrogen, nitrogen, or both.

Other gases which provide essentially non-reactive etchant species, such as argon, helium, neon, krypton, and xenon may be present in varying amounts, by way of example, and not by way of limitation.

In addition, the addition of a small amount of hydrocarbon may be beneficial in the control of etch profile of the high temperature organic polymeric material.

It is also possible to use a hydrocarbon-based plasma for etching of the high temperature organic polymeric material. The hydrocarbon-based plasma may optionally include a lesser amount of a component selected from the group consisting of ammonia, hydrogen, nitrogen, and combinations thereof. Other gases which provide essentially non-reactive etchant species, such as argon, helium, neon, krypton, and xenon may also be present in varying amounts, by way of example.

When an integrated series of process steps is carried out in a single process chamber and a process step produces a byproduct which includes at least one element harmful to the final device structure, wherein that element is selected from the group consisting of oxygen, fluorine, chlorine, or bromine, it is advisable to dry clean the process chamber subsequent to that process step and prior to proceeding to an etch step using the present method for etching an organic polymeric material. This is particularly important when the feature size of the pattern being etched is 0.25 µm or smaller. As an alternative to repetitive cleaning of process chambers, it is possible to use an integrated processing system which provides several processing chambers which are interconnected in a manner such that a substrate can be passed from chamber to chamber under a controlled environment, and to reserve one of such process chambers for etching using the present method etch chemistry.

An economical method of performing the etch techniques described above utilizes a combination of different plasmas wherein the different etchant gases used to create each plasma are sufficiently compatible that all of the etching steps can be carried out in individual (separate) steps in the same etch chamber, if desired. One skilled in the art can select from the various known plasma etchants to obtain the best economies of function which will provide etched features meeting dimensional and surface stability requirements.

BRIEF DESCRIPTION OF THE DRAWINGS

FIGS. 1A through 1E show a schematic of the cross-sectional view of a prior art multilayered structure useful in plasma etching (a plasma etch stack), as the etch stack progresses through a series of process steps. This etch stack is generally used for etching of a device feature conductive material layer.

FIG. 2A shows a schematic of the cross-sectional view of a first preferred embodiment plasma etch stack of the present invention. FIGS. 2B through 2G show the changes in the etch stack as it progresses through the method steps of the present invention.

FIG. 3A shows a schematic of the cross-sectional view of a second preferred embodiment plasma etch stack of the present invention. FIGS. 3B through 3G show the changes in the etch stack as it progresses through the method steps of the present invention.

DETAILED DESCRIPTION OF THE PREFERRED EMBODIMENTS

Figure 4A:
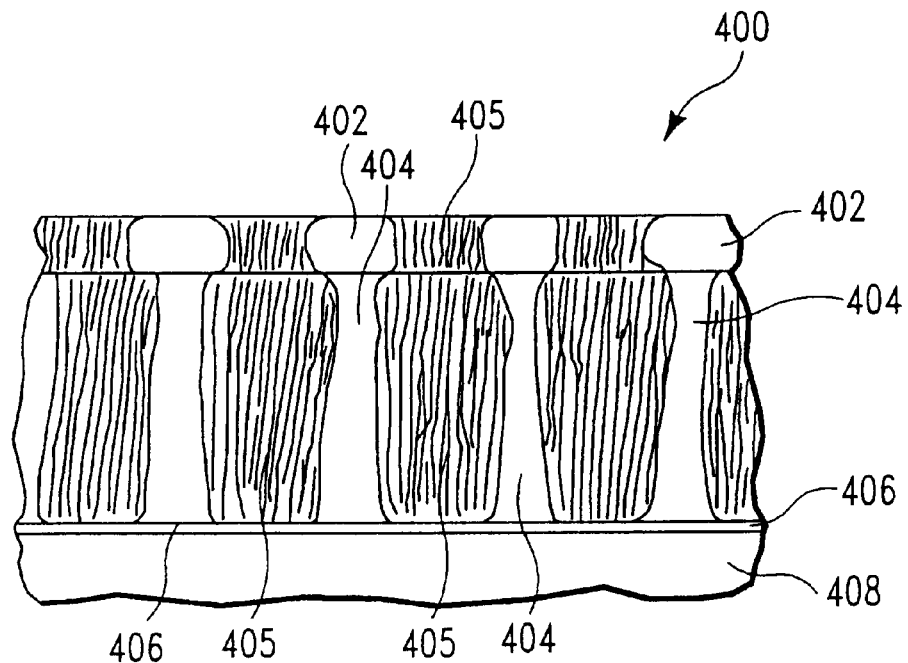
FIG. 4A shows a schematic of a cross-sectional view of a series of etched contact vias, where each via is created through a multilayered structure which includes, from top to bottom, a layer of silicon oxide patterned hard mask, and a layer of FLARE™ low dielectric constant material. Underlying the low k dielectric is a layer of titanium nitride, and underlying the titanium nitride is a layer of aluminum. Due to the etch chemistry used to etch the via, the low k dielectric, a poly(arylene ether) is severely undercut beneath the patterning silicon oxide hard mask.

In accordance with the present invention, we have developed two patterning systems which enable the patterning of underlying layers while providing for the easy removal of masking layers used to accomplish the patterning. Further, we have developed an etch chemistry which is useful in the pattern etching of organic, polymeric material layers during formation of contact/interconnect structures. The etch may be for mask opening prior to etch of an underlying conductive layer, or may be for preparation of an electrical contact via in a general process, or may be for preparation of a damascene or dual damascene structure.

I. DEFINITIONS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to "a conductive material" includes aluminum, aluminum alloys, copper, copper alloys, platinum, platinum alloys, iridium, iridium alloys, tungsten, tungsten alloys, combinations thereof, and other conductive materials which would be suitable in the application described.

Specific terminology of particular importance to the description of the present invention is defined below.

The term "α-C" refers to high temperature amorphous carbon-comprising materials which are typically produced by CVD in a plasma chamber.

The term "α-FC" refers to high temperature fluorocarbon materials which are typically produced by CVD in a plasma chamber.

The term "aluminum" includes alloys of aluminum of the kind typically used in the semiconductor industry. Such alloys include aluminum-copper alloys, and aluminum-copper-silicon alloys, for example. Typically such alloys of aluminum comprise about 0.5% copper.

The term "anisotropic etching" refers to etching which does not proceed in all directions at the same rate. If etching proceeds exclusively in one direction (e.g. only vertically), the etching process is said to be completely anisotropic.

The term "bias power" refers to the power used to control ion bombardment energy and the directionality of ions toward a substrate.

The term "copper" refers to copper and alloys thereof, wherein the copper content of the alloy is at least 80 atomic % copper. The alloy may comprise more than two elemental components.

The term "feature" refers to metal lines and openings on a substrate, and other structures used to form a semiconductor device.

The term "high density plasma" refers to, but is not limited to, a plasma having an electron density of at least $5 \times 10^{10}$ $e^-/cm^3$.

The term "hydrogen-based plasma" refers to a plasma having a sufficiently high hydrogen content to reduce the corrosion of the exterior surfaces of etched features by incident reactive species which are present due to etching of adjacent surfaces. A preferred example of a hydrogen-based plasma is described in co-pending application Ser. No. 08/911,878, filed Aug. 13, 1997.

The term "hydrogen/nitrogen-based plasma" refers to a plasma having principally hydrogen-comprising and/or nitrogen-comprising etchant species. In addition, depending on the materials used in the device fabrication, the concentration of at least one etchant species generated from a source comprising an element selected from the group consisting of oxygen, chlorine, fluorine, and bromine is minimized. A preferred plasma source gas for producing a hydrogen/nitrogen-based plasma comprises ammonia; or hydrogen and nitrogen; or a combination of ammonia with hydrogen, nitrogen, or both. Other essentially chemically inert components such as argon, helium, neon, krypton, and xenon may be present in varying amounts, by way of example, and not by way of limitation.

The term "hydrocarbon-based plasma refers to a plasma having principally hydrogen and carbon-comprising etchant species. The hydrocarbon-based plasma may optionally include a lesser amount of a component selected from the group consisting of ammonia, hydrogen, nitrogen, and combinations thereof. Other gases which provide essentially non-reactive etchant species may be present in varying amounts. In addition, depending on the conductive material to be used in the device structure, the plasma source gas may contain an additive element or compound (for purposes of controlling etch rate or profile) which generates up to about 30 atomic % or less of the total etchant species, where such additive etchant species comprises oxygen, or fluorine, or chlorine, or bromine. Preferred plasma source gases for producing a hydrocarbon-based plasma comprises methane or α-carbon.

The term "ion bombardment" refers to physical bombardment by ions (and other excited species of atoms which are present with the ions) to remove atoms from a surface, where physical momentum transfer is used to achieve the atom removal.

The term "isotropic etching" refers to an etching process where etching can proceed in all directions at the same rate.

The term "oxygen-based plasma" refers to a plasma which is rich in oxygen content either in neutral or charged form. The plasma may include additives comprising nitrogen, or hydrogen, or chlorine, or fluorine, or carbon, by way of example and not by way of limitation. Additives such as $CF_4$, $CH_4$ and $NH_3$ are commonly used.

The term "plasma" refers to a partially ionized gas containing an equal number of positive and negative charges, as well as some other number of non-ionized gas particles.

The term "plasma-polymerized methysilane" refers to a new deep UV resist material which is deposited from a low power RF plasma discharge in methylsilane at room temperature. This material possesses an amorphous organosilicon hydride network structure. While initially opaque in the deep UV (i.e. 248 nm), a typical 0.25 micron thick film undergoes efficient photooxidation with bleaching to form glass-like siloxane network material.

The term "shading damage" refers to, but is not limited to, damage to device structures which occurs when a conductive feature becomes charged with ions, as electrons are trapped by the mask over a high aspect ratio feature, creating a voltage across device features which results in a shift in the performance parameters of the device.

The term "source power" refers to the power used to generate ions and neutrals whether directly in an etching chamber or remotely as in the case of a microwave plasma generator.

The term "substrate" includes semiconductor materials, glass, ceramics, polymeric materials, and other materials of use in the semiconductor industry.

II. AN APPARATUS FOR PRACTICING THE INVENTION

The preferred embodiment etch processes described herein were carried out in a CENTURA® Integrated Processing System available from Applied Materials, Inc. of Santa Clara, Calif. The system is shown and described in U.S. Pat. No. 5,186,718, the disclosure of which is hereby incorporated by reference. This equipment included a Decoupled Plasma Source (DPS) of the kind described by Yan Ye et al. at the Proceedings of the Eleventh International Symposium of Plasma Processing, May 7, 1996 and as published in the Electrochemical Society Proceedings, Volume 96-12, pp. 222–233 (1996). The plasma processing chamber enables the processing of an 8 inch (200 mm) diameter silicon wafer.

Figure 5:
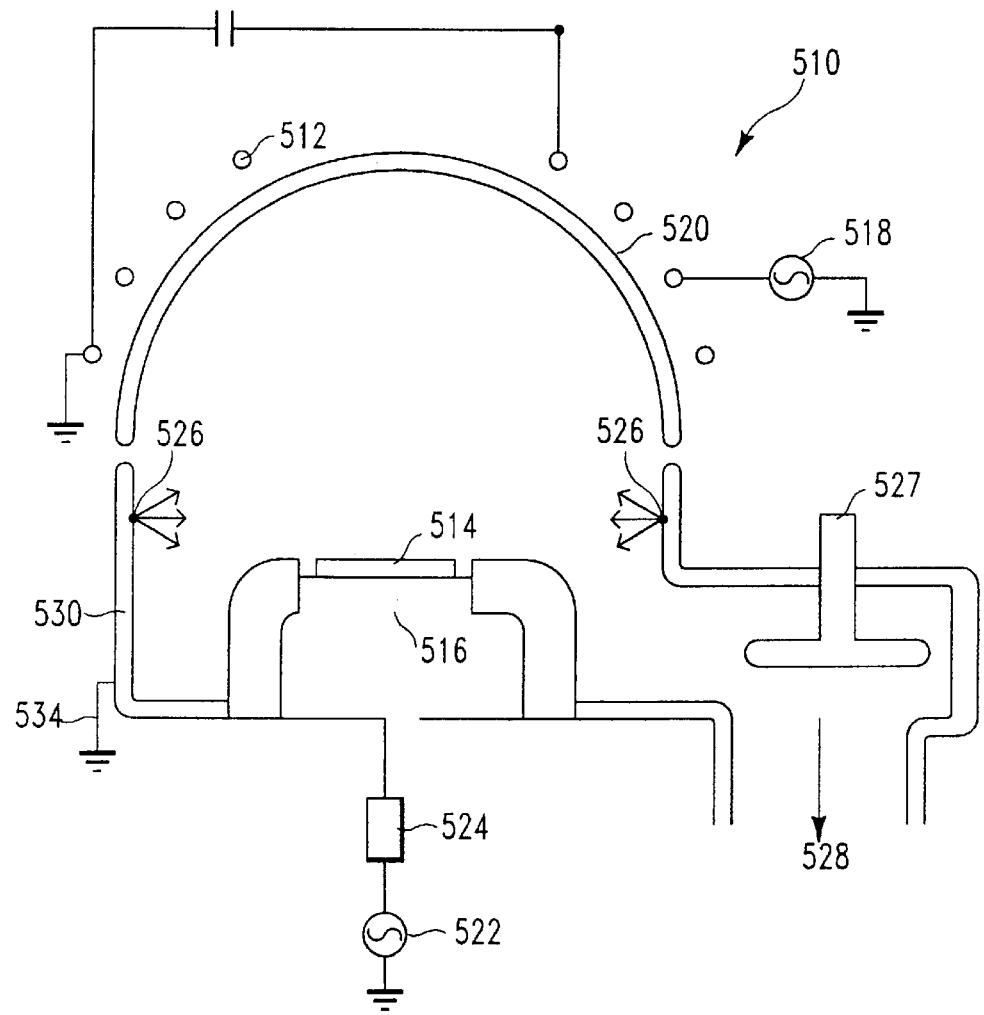
FIG. 5 is a schematic of a process chamber and auxiliary apparatus of the kind which can be used to carry out the plasma etching steps described herein.

A schematic of the processing chamber is shown in FIG. 5 which shows an etching process chamber 510, which is constructed to include at least one inductive coil antenna segment 512 positioned exterior to a dielectric, dome-shaped ceiling 520, and connected to a radio frequency (RF) power generator 518. Interior to the process chamber is a substrate 514 support pedestal 516 which is connected to an RF frequency power generator 522 through an impedance matching network 524, and a conductive chamber wall 530 which serves as the electrical ground 534.

The semiconductor substrate 514 is placed on the support pedestal 516 and gaseous components are fed into the process chamber through entry ports 526. A plasma is ignited in process chamber 510 using techniques well known in the industry. Pressure interior to the etch process chamber 510 is controlled using a vacuum pump (not shown) and a throttle valve 527 connected to a process chamber gas exit line 528. The temperature on the surface of the etch chamber walls is controlled using liquid-containing conduits (not shown) which are located in the walls of the etch chamber 510. For experimental purposes, it was desired to maintain the substrate temperature above about 150° C. and below about 350° C., and this was accomplished using a resistivity heater applied to the substrate support pedestal. The surface of the etching chamber 510 walls was maintained at about 80° C. using the cooling conduits previously described. In the case of a production process, preferably, the substrate support platen provides for backside heating or cooling of the substrate.

Figure 6:
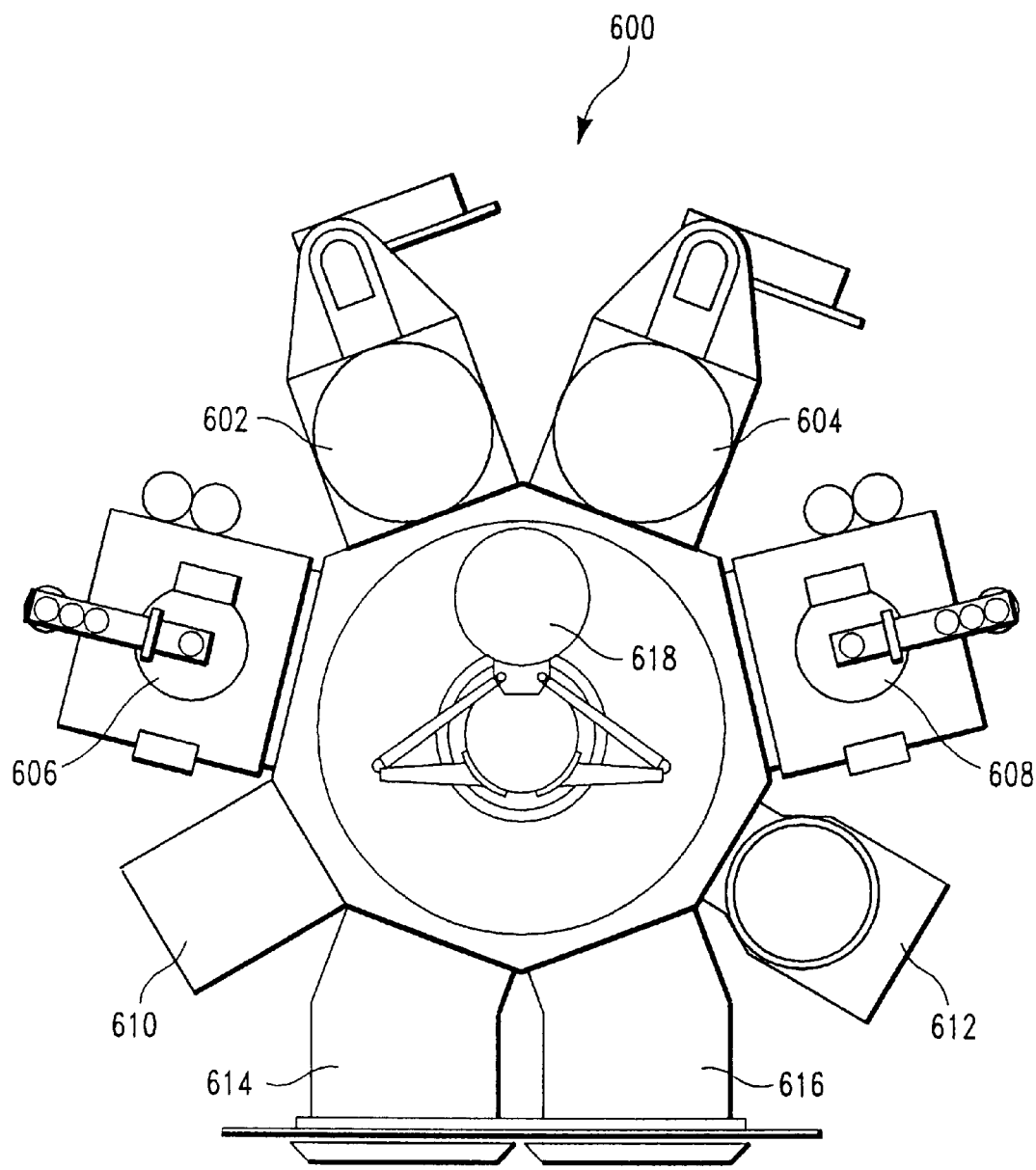
FIG. 6 is a schematic of a processing system which includes a variety of process chambers which permit transfer of substrates from one chamber to another under a controlled environment. For example, the substrate is not exposed to air or moisture.

FIG. 6 is a schematic of a processing system 600 which includes a variety of process chambers which permit transfer of substrates from one chamber to another under a controlled environment. Typically, a processing system 600 includes etch chambers 602 and 604 (which are preferably etch chambers where the power source for plasma generation is separately controlled from the power source used to apply bias to a substrate). In addition, system 600 frequently includes stripping-passivation chambers 606 and 608 which provide for the removal of contaminants from the etched surface; a substrate orienter 612; a cool-down chamber 610, and loadlocks 614 and 616.

III. A FIRST PREFERRED EMBODIMENT ETCH STACK AND ITS METHOD OF USE

FIGS. 2A–2G illustrate the first preferred embodiment etch stack of the present invention as it progresses through method steps used in preparing a device structure. FIGS. 2A through 2C show the opening of a masking structure in preparation for etch of an underlying conductive layer; FIGS. 2D through 2F show etching of the conductive layers; and FIG. 2G shows the application of a "capping" dielectric layer. FIG. 2A shows the complete etch stack 210, including: Substrate 212, which was a dielectric layer of silicon dioxide approximately 1,000 Å thick overlying a silicon wafer surface (not shown). A layer 214, of tantalum nitride approximately 500 Å thick was deposited over substrate 212. A layer 216 of copper approximately 8,000 Å thick was deposited over barrier layer 214. A layer 218 of tantalum nitride about 500 Å thick, which served as a barrier layer, was deposited over copper layer 216. A layer 220 of a high-temperature organic-based pattern masking material comprising α-FC was deposited over tantalum nitride layer 218 using a high density plasma CVD technique, to produce a layer approximately 8,000 Å thick. A silicon dioxide pattern masking layer 222, approximately 1,000 Å thick, which served as a high-temperature inorganic masking material, was applied over the high-temperature α-FC layer 220. And, finally, a photoresist imaging layer 224, of I-line stepper material (any of these materials which are commonly used in the art are acceptable) approximately 10,000 Å thick was applied over the surface of high-temperature inorganic masking material layer 222.

In FIG. 2A, I-line photoresist imaging layer 224 has already been patterned to provide the feature shape desired to be transferred to the silicon dioxide pattern masking layer 222 and high-temperature organic-based masking layer 220. Preferably, the thickness of photoresist imaging layer 224 is designed so that it is nearly totally consumed during transfer of the pattern through the high-temperature inorganic masking layer 222 and high-temperature organic-based masking layer 224.

FIG. 2B shows the plasma etching stack described in FIG. 2A, where the pattern in photoresist imaging layer 224 has been transferred through the high temperature silicon dioxide inorganic pattern masking layer 222 and slightly into the α-FC-comprising layer 220. This pattern transfer was accomplished in the Centura® Integrated Processing System previously described, using a fluorine-containing plasma of the kind generally known in the art for etching silicon dioxide. During the etching of silicon dioxide layer 222, the plasma feed gas to the process chamber was about 100 sccm of argon and 30 sccm of $CHF_3$. The substrate temperature during etching was about 20° C., with the process chamber walls at about 80° C. The process chamber pressure during etching was about 10 mT. The source power to the plasma inducing coil was about 1800 W @ 2 MHZ and the bias power to the substrate support platen was about 300 W @ 13.56 MHZ. A plasma was ignited using techniques standard in the art, and the time period required for pattern transfer through silicon dioxide layer 222 was approximately 15 seconds. Subsequently, without extinguishing the plasma, the plasma feed gas was changed to an oxygen-based plasma for etching the α-FC layer 220. The plasma feed gas to the process chamber was 100 sccm of $O_2$, and 10 sccm of $N_2$. The substrate temperature during etching was about 20° C., with the process chamber walls at about 80° C. The process chamber pressure during etching was about 10 mT. The source power to the plasma inducing coil was about 1000 W @ 2 MHZ and the bias power to the substrate support platen was about 250 W @ 13.56 MHZ. The time period required for pattern transfer through α-FC layer 220 was approximately 80 seconds. An alternative to using this oxygen-based plasma is to use the hydrogen/nitrogen-based plasma etch chemistry of the present invention, which will be discussed in detail subsequently.

FIG. 2C shows the plasma etching stack described in FIG. 2B, after removal of residual photoresist imaging layer 224. Residual photoresist imaging layer 224 was removed using the oxygen-based plasma and etch conditions described with reference to the α-FC layer 220, with an etch time period of about 20 seconds. The hydrogen/nitrogen-based plasma etch chemistry could be used for removal of this photoresist layer as well. The underlying layer 222 of silicon dioxide was used as an etch stop over high-temperature organic-based layer 220, while tantalum nitride barrier layer 218 was used as the etch stop protecting copper layer 216 from oxidation. The plasma and process conditions described above provided anisotropic stripping of photoresist imaging layer 224, so that high-temperature α-FC masking layer 220 would not be undercut during the removal of residual photoresist imaging layer 224.

It is preferable to use the hydrogen/nitrogen-based etch chemistry for etching both photoresist layer 224 and high-temperature organic-based layer 220 when copper is the conductive layer, as this reduces the potential for oxidation of the copper.

FIG. 2D shows an optional step in which the layer 222 of silicon dioxide may be removed. However, for most applications, such as this application where feature layer 216 comprises a metal (copper), if the thickness of silicon dioxide layer 222 is properly designed, this layer will be automatically removed during the patterning of feature layer 216. Preferably the etch selectivity of the materials is such that layer 222 etches more rapidly than layer 220, so that the desired mask profile is obtained.

FIG. 2E shows the plasma etching stack after transfer of the pattern through tantalum nitride barrier layer 218, copper layer 216, and tantalum nitride barrier layer 214 to the upper surface of silicon dioxide dielectric layer 212. This etching of the conductive copper layer 216 and accompanying barrier layers 218 and 214 was accomplished using a feed gas to the process chamber of 70 sccm of HCl, 50 sccm of $N_2$, and 5 sccm of $BCl_3$. The substrate temperature during etching was about 250° C., with the process chamber walls at about 80° C. The process chamber pressure during etching was about 20 mT. The source power to the plasma inducing coil was about 1,500 W @ 2 MHZ and the bias power to the substrate support platen was about 600 W @ 13.56 MHZ. The end point of etch through tantalum nitride barrier layer 214 was measured by optical monitoring using a sensor measuring at a wavelength of about 3,590 Å. The time period required for pattern transfer through the tantalum nitride barrier layer 218, copper layer 216, and tantalum nitride barrier layer 214 was about 150 seconds. A hydrogen-based etch chemistry was used during patterning of the copper feature layer 216 to avoid corrosion of the copper. This hydrogen-based etch chemistry uses HCl as its principal etchant species source (to produce hydrogen and chlorine-comprising etchant species), and is distinguishable from a hydrogen/nitrogen-based etch chemistry which uses principally hydrogen-comprising and/or nitrogen-comprising etchant species.

Depending on the relative thicknesses of layers α-FC layer 220, tantalum nitride 218, copper layer 216, and tantalum nitride layer 214, and the etching conditions used, there should be enough of the α-FC layer 220 remaining at the end of the etch process to provide CD (critical dimension) control. Therefore, a separate process is needed to remove the remaining portion of this α-FC layer. The process for stripping the α-FC layer may be carried out in the feature patterning etch chamber or in a downstream plasma chamber.

FIG. 2F shows the patterned copper feature layer 216 with accompanying barrier layers 214 and 218, after removal of the remaining portion of the α-FC layer 220. The α-FC layer 220 may be removed via anisotropic stripping using a hydrogen-based chemistry of the kind described above. The α-FC layer may also be removed using a wet stripping process using a solvent which assists in the passivation of the etched copper feature surface. In the present instance, a hydrogen/nitrogen-based plasma was used in combination with an anisotropic dry stripping technique, wherein the feed gas to the process chamber was 100 sccm of $H_2$. The substrate temperature during etching was about 45° C., with the process chamber walls at about 80° C. The process chamber pressure during etching was about 10 mT. The source power to the plasma-inducing coil was about 1,000 W @ 2 MHZ and the bias power to the substrate support platen was about 200 W @ 13.56 MHZ. The time period required for stripping of the remaining portion of the α-FC layer 220 was about 120 seconds. If the conductive layer 216 had been aluminum, tungsten, platinum, or iridium, an oxygen-based plasma could have been used to remove the αFC layer 220 without concern about corrosion of the conductive layer.

FIG. 2G shows the application of a dielectric capping layer 230 of a low dielectric constant material such as an α-C or an α-FC over patterned tantalum nitride layer 218, copper layer 216, tantalum nitride layer 214, and silicon dioxide substrate 212. The capping layer 230 provided electrical isolation between the conductive copper layer 216 and the surrounding environment. Due to the thinness of tantalum nitride layer 218, the upper surface 219 of the structure was far more planar than the surface 120 observed for the prior art planarization layer illustrated in FIG. 1E. Preferably the α-C or an α-FC is applied using a vapor deposition technique known in the art, although spin-on techniques, for example, are also acceptable.

One skilled in the art will recognize that high-temperature inorganic masking materials other than silicon oxide can be used as the capping layer overlying the high-temperature organic-comprising masking material. In addition, one skilled in the art will recognize that high-temperature organic-based masking materials other than α-FC, such as α-C, polyimide, parylene, and teflon, for example, can be used. Anti-reflective/barrier layer materials other than tantalum nitride, such as silicon oxynitride, tantalum, titanium nitride, tungsten titanate, and tungsten nitride may also be used. And finally, the method is not limited to the etching of device features which utilize copper as the conductive material. Other conductive materials which require high etch temperatures (in excess of about 200° C.), such as platinum, silver, gold, iridium, for example, can be used. Further the method offers advantages in the etching of conductive materials which require lower etch temperatures (below about 200° C.), such as aluminum or tungsten, when the feature size is below about 0.25 μm and selectivity to the conductive material over masking materials makes control of the etch process difficult.

FIGS. 2A through 2C can also be used to describe a second embodiment of the present invention in which the specialized etch chemistry previously described is used to prepare a contact via structure. If the conductive material shown in FIGS. 2A through 2C did not form a layer 216 (as shown) but instead formed a series of lines which ran perpendicular into the page and parallel to each other at locations 221 (surrounded by an inter-metal dielectric), openings 223 could be used to form contact vias by deposition of a conductive fill material (not shown) therein. By way of explanation, with reference to FIGS. 2A through 2C, if layer 220 is a low k dielectric (or other dielectric organic polymer layer), subsequent to patterning of the layer, a diffusion barrier layer and/or a wetting layer (not shown) is applied over the etched surfaces, followed by deposition of a conductive layer (not shown). The excessive conductive material (not shown) overlying the mask patterning layer 222 (and mask patterning layer 222, if desired) is then removed either by etch back or by chemical-mechanical polishing.

IV. A SECOND PREFERRED EMBODIMENT ETCH STACK AND ITS METHOD OF USE

FIGS. 3A–3G illustrate the second preferred embodiment etch stack of the present invention and its progression through the method steps of the present invention. FIG. 3A shows the complete etch stack, including: Substrate 312, which was a dielectric layer of silicon dioxide approximately 10,000 Å thick overlying a silicon wafer surface (not shown). A barrier layer 314, of tantalum nitride approximately 500 Å thick was deposited over substrate 312. A layer 316 of copper approximately 8,000 Å thick was deposited over barrier layer 314. A layer 318 of tantalum nitride about 500 Å thick was deposited over copper layer 316. A layer 320 of a high-temperature organic-based pattern masking material comprising α-FC was deposited over tantalum nitride layer 318 using a high density plasma CVD technique, to produce a layer approximately 8,000 Å thick. And, finally, a layer 322 of plasma polymerized methylsilane (PPMS) was deposited from a low power RF plasma discharge in methylsilane at room temperature, to produce a layer approximately 1,000 Å thick.

Subsequently, the PPMS layer was imaged using deep UV in the presence of oxygen to produce a glass-like siloxane pattern 324 within PPMS layer 322, as shown in FIG. 3B. FIG. 3C illustrates the pattern development of the PPMS high temperature imaging layer 324, which was developed using chlorine plasma etching by techniques known in the art (as described by T. W. Weidman et al., Journal of Photopolymer Science and Technology, Volume 8, Number 4, 679–686 (1995)).

Subsequently, as shown in FIG. 3D, the underlying α-FC layer 320 was etched using an oxygen-based plasma in the manner described above with reference to FIG. 2B, where α-FC layer 220 was patterned. The time period required for pattern transfer through α-FC layer 320 was approximately 80 seconds. The oxygen-based plasma chemistry was chosen so that the patterned silicon dioxide 324 formed from the high-temperature imageable material (PPMS) layer 322 and tantalum nitride barrier layer 318 would not be attacked during etching of α-FC layer 320. The oxygen-based etch conditions referenced above provided anisotropic etch conditions so that undercutting of the α-FC layer 320 during pattern development was avoided.

FIG. 3E shows the transfer of the pattern through tantalum nitride barrier layer 318, copper layer 316, and tantalum nitride barrier layer 314 to the upper surface of silicon dioxide dielectric layer 312. This etching of the conductive copper layer 316 and accompanying barrier layers 318 and 314 was accomplished using the method described with reference to FIG. 2E.

Depending on the relative thicknesses of layers α-FC layer 320, tantalum nitride 318, copper layer 316, and tantalum nitride layer 314 and the etching conditions used, there should be enough of the α-FC layer 320 remaining at the end of the etch process to provide CD (critical dimension) control. Therefore, a separate process is needed to remove the remaining portion of this α-FC layer. The process for stripping the α-FC layer may be carried out in the feature patterning etch chamber or in a downstream plasma chamber.

FIG. 3F shows the patterned feature layer 316 with accompanying barrier layers 318 and 314, after removal of the remaining portion of the α-FC layer 320. Preferably the α-FC layer 320 is removed via anisotropic stripping using a hydrogen based chemistry of the kind described above or a wet stripping process using a solvent which assists in the passivation of the etched copper feature surface. In the present instance, an anisotropic dry stripping technique, as described with reference to FIG. 2F was used.

FIG. 3G shows the application of a planarization layer 328 of a low dielectric constant material such as an α-C or an α-FC over the patterned tantalum nitride layer 318, copper layer 316, tantalum nitride layer 314, and silicon dioxide substrate 312. The inter-metal dielectric layer exhibited a relatively planar surface, compared with the non-planar surface 120 observed for the prior art planarization layer illustrated in FIG. 1E. Preferably the α-C or an α-FC is applied using a vapor deposition technique known in the art, although spin-on techniques, for example, are also acceptable.

One skilled in the art will recognize that other precursor materials can be used to create a photosensitive siloxane material similar to PPMS, to produce a satisfactory mask layer for pattern transfer to the high-temperature organic-comprising masking material. In addition, one skilled in the art will recognize that other high-temperature organic-based masking materials, ARC materials, barrier layer materials, and conductive materials, such as those previously listed (and not by way of limitation) can be used.

It is important to mention that when copper is used as the conductive material, the etching methods disclosed in U.S. application Ser. Nos. 08/891,410, and 08/911,878, referenced above, are recommended for use in combination with the methods of the invention described herein.

In particular, application Ser. No. 08/891,410 discloses that copper can be pattern etched at acceptable rates and with selectivity over adjacent materials using an etch process which utilizes a solely physical basis such as ion bombardment, without the need for a chemically based etch component.

A first preferred enhanced physical bombardment technique requires an increase in ion density and/or an increase in ion energy of ionized species which strike the substrate surface. An increase in ion density is preferably achieved by placing a device inside the etch chamber above the substrate surface, which device enables an increase in the number of ionized particles striking the substrate surface. An example of such a device is an inductive coil which is used to create a high density plasma having an increased number of active species or to maintain the number of active species supplied by another source so that an increased number of ionized species are available to strike the substrate surface.

A second preferred method for increasing the number of ionized species is to feed into the process chamber a microwave-generated plasma produced outside of the chamber. It is also possible to increase the number of ionized species by increasing the RF power to an external inductively coupled coil or to increase the DC power to a capacitively coupled source for ion species generation. However, these latter two techniques are less preferred methods for increasing ion density, since the copper (and alloy metal(s)) atoms generated during etching affect the performance of an external coil and since capacitively coupled species generation is not very efficient. By ion energy, it is meant the energy of the ion at the time it strikes the substrate surface. A second preferred enhanced physical bombardment technique is increasing (to the limit that the substrate is detrimentally affected) the ion energy. Ion energy may be increased by increasing an offset bias on the substrate which attracts the ionized species toward the substrate. This is typically done by increasing the RF power to a platen on which the substrate sets. The effectiveness of an increase in the bias power is dependent upon the RF frequency and the ratio of the bias grounding area to the surface area of the substrate. Ion energy is further increased by operating the etch process chamber at a lower pressure, typically down to about 20 mT, depending on the gases present.

A technique which is beneficial in tuning the physical bombardment used in a sputtering process is a pulsing of the ion density or the ion energy. One preferred means of pulsing the ion energy is to pulse the power to the device which produces the ion species or which is used to increase or maintain the number of ionized species available to strike the substrate surface. Such pulsing is preferably applied to a device located internally within the process chamber. The pulsing may be of the feed rate of an externally-generated plasma into the process chamber. Less preferably, the pulsing may be applied to an external inductively coupled source for plasma generation or to a capacitively coupled source for plasma generation. An even more preferred means of pulsing the ion energy is by pulsing the power to the offset bias source which is applied to the substrate. Pulsing of the ion energy reduces the possibility that an excited copper atom leaving the copper surface during etching will reattach to the copper surface in an adjacent location. The pressure in the process vessel may also be pulsed as a means of pulsing the ion energy.

Another technique which is beneficial in tuning the physical bombardment is the use of thermal phoresis. Thermal phoresis occurs when the temperature of the substrate surface is higher than the temperature of the etch chamber surfaces (walls), whereby particles dislodged from the higher temperature substrate surface are attracted toward the colder chamber surfaces, whereby improved removal of copper from the etch surface is achieved.

It is possible to use a combination of physical ion bombardment with a chemically reactive ion component, so long as the concentration of the chemically reactive ion component is sufficiently low that the etching is carried out in a physical bombardment dominated etch regime. Preferably this combination technique is carried out at temperatures above about 150° C. and at pressures below about 50 mT. Since the additional energy provided by the physical bombardment is added to the formation of volatile chemical reaction-generated compounds, the copper removal rate is not limited solely to the rate of formation of the volatile compounds and the ability of a low process chamber pressure to facilitate removal of such volatile compounds. When physical ion bombardment dominates the etch process, the pressure in the process chamber can be adjusted, to permit increased ion bombardment. An overall synergistic effect occurs, enhancing the copper atom removal rate. The preferred chemically reactive ion species is a halogen-comprising species or compound having a low molecular weight, such as $Cl_2$, HCl, $BCl_3$, HBr, $CHF_3$, $CF_4$, $SiCl_4$, and combinations thereof. When a chlorine-comprising species is used, the chlorine-comprising components present in the feed gases to the etch chamber should be no greater than 30 volume % of the gases fed into the etch chamber during the patterned copper etch. A passivating agent such as $N_2$, $NH_3$, and $CH_4$ may be used in combination with the chemically reactive ion species. The content of copending application Ser. No. 08/891,410 is hereby incorporated by reference in its entirety.

Application Ser. No. 08/911,878 describes an alternative copper etching technology which employs HCl and HBr chemistries in a manner which protects copper from corrosion during the etching process. In particular, copper can be pattern etched in the presence of HCl or HBr while providing the desired feature dimension and integrity if the surface of the copper feature being etched is properly protected during etching. To avoid the trapping of reactive species which can act as a corrosive agent interior of the etched copper surface, hydrogen is applied to that surface. Hydrogen is adsorbed on the copper exterior surface and may be absorbed through the exterior surface of the copper into the bulk copper, so that it is available to react with species which would otherwise penetrate that exterior surface and react with the copper interior to that surface. Sufficient hydrogen must be applied to the exterior surface of the etched portion of the copper feature to prevent incident reactive species present due to etching of adjacent feature surfaces from penetrating the previously etched feature exterior surface.

Although any plasma feed gas component comprising hydrogen, which is capable of generating sufficient amounts of hydrogen, may be used, the most preferred embodiment of the invention provides for the use of a component which contains both hydrogen and halogen. Preferred examples are hydrogen chloride (HCl) and/or hydrogen bromide (HBr), which are used as the principal source of the reactive species for etching copper. Dissociation of the HCl and/or HBr provides large amounts of hydrogen for protection of etched copper surfaces, thereby preventing penetration by reactive species adjacent the etched surface. Additional hydrogen gas may be added to the plasma feed gas which comprises the HCl and/or HBr when the reactive species density in the etch process chamber is particularly high. The hydrogen-releasing, halogen-comprising plasma feed gas component may be used as an additive (producing less than 40% of the plasma-generated reactive species) in combination with other plasma etching species.

When HCl and/or HBr is used as the principal source of reactive species for the copper etching, the HCl or HBr are the source for at least 40%, and more preferably at least 50%, of the reactive species generated by the plasma. Other reactive species may be used for purposes of feature surface passivation during etching or for purposes of feature surface protection after completion or near the completion of feature surface etching. The species added for surface passivation or surface protection during etching of the copper feature preferably make up 30% or less, or more preferably make up 10% or less of the plasma-generated reactive species. By way of example, additional gases which may be added to the plasma feed gas include $CH_4$, $CH_3F$, $BCl_3$, $N_2$, $NH_3$, $SiCl_4$, $CCl_4$, and $CHF_3$. Plasma feed gases may include additional inert (non-reactive with copper) gases such as argon, helium, or xenon, to enhance the ionization, or dissociation, or to dilute the reactive species. The critical feature is the availability of hydrogen at the feature surface during the etching process. The content of U.S. application Ser. No. 08/911,878 is hereby incorporated by reference in its entirety.

FIGS. 3A through 3D can also be used to describe a second embodiment of the present invention in which the specialized etch chemistry previously described is used to prepare a contact via, in the manner described with reference to FIGS. 2A through 2C. In this instance the location of the conductive lines is indicated by identification number 321, with openings 323 showing the contact vias into which a conductive material is deposited. By way of explanation, with reference to FIGS. 3A through 3D, if layer 320 is a low k dielectric (or other dielectric organic polymer layer), subsequent to patterning of the layer, a diffusion barrier layer and/or a wetting layer (not shown) is applied over the etched surfaces, followed by deposition of a conductive layer (not shown). The excessive conductive material (not shown) overlying the mask patterning layer 324 (and mask patterning layer 324, if desired) is then removed either by etch back or by chemical-mechanical polishing.

V. APPLICATION OF THE METHOD OF THE INVENTION FOR ETCHING ALUMINUM

During discussion of the preferred embodiments of the invention above, it was mentioned that the invention is also useful for conductive materials which can be etched at lower temperatures (below about 200° C.), and particularly for aluminum and tungsten. Although standard photoresist materials can be used as the masking material for aluminum when feature size of the pattern is larger than about 0.25 μm, at smaller feature sizes selectivity becomes a problem. At these smaller geometries, as etching progresses, the structural angles involved results in more rapid deformation of the masking pattern profile, affecting the etch profile. With this in mind, it is necessary to transfer the pattern from the photoresist into a thicker and/or more stable masking material which can maintain the desired pattern profile for a longer time period in the aluminum etch plasma. A thicker masking material results in an increased aspect ratio which can lead to shading damage of underlying device structures, as previously described. With this in mind, a more stable hard masking material such as silicon oxide or silicon nitride is preferable. This masking material, which provides better etch selectivity toward aluminum, can be a thinner patterned layer and still provide the etch time necessary to transfer the desired pattern to underlying layers.

However, when a hard masking material is used, the problem of removal of the residual masking material occurs, as previously described. Often the hard masking material is a silicon oxide and the substrate underlying a patterned aluminum interconnect structure is also silicon oxide. This makes it difficult to remove the masking material without damaging the substrate.

It is possible to leave residual hard masking material atop a patterned aluminum feature, but this affects the functionality of the finished device. To improve the operational speed of the device, it is preferable to use a low k dielectric as the inter-metal dielectric (for filling gaps between lines and as the dielectric layer which is etched to provide for contact vias). The effectiveness of the low k dielectric in increasing device speed is substantially impacted by the presence of residual high dielectric constant material such as silicon dioxide. Further, if a residue of silicon dioxide remains on top of a metal structure which is to become part of a multi-layer metal device, there may be a problem in subsequent process steps. When a silicon dioxide hard mask is used for pattern transfer through an organic polymeric dielectric overlying the metal structure, prior to reaching the metal surface the etching may stop on silicon dioxide residue overlying the surface of the metal structure.

The method of the present invention makes it possible to use easily removable masks which are more resistant to aluminum etch plasmas than photoresist.

When aluminum is the metal layer being patterned, the method is the same as described with reference to the First and Second Preferred Embodiments, as described with respect to FIGS. 2A through 2G and FIGS. 3A through 3G, with the following major exceptions (there may be other minor differences which will be understood and appreciated by one skilled in the art). Typically the barrier layer is titanium nitride rather than tantalum nitride; the substrate temperature during etching of the aluminum layer is less than about 150° C., preferably less than about 90° C., with the process chamber walls at about 80° C. Plasma source gas composition during etching of the aluminum layer will typically be 150–30 sccm of $Cl_2$/100–0 sccm of $BCl_3$/0–40 sccm $N_2$/0–20 sccm $CH_xF_y$ (where x ranges from 0 to about 4 and y ranges from 0 to about 4). The process chamber pressure during etching generally ranges between about 5 mT and 50 mT. The source power to the plasma-inducing coil typically ranges from about 500 W to about 2,000 W @ 2 MHZ and the bias power to the substrate support platen ranges from about 50 to about 250 W @ 13.56 MHZ.

When the high temperature organic-based masking material used in the present invention is a low k dielectric material, for example but not by way of limitation, Poly (arylene)ethers, Poly(arylene)ether oxazoles, Parylene-N, Polyimides, Polynaphthalene-N, Polyphenyl-Quinoxalines, Polybenzoxazoles, Polyindane, Polynorborene, Polystyrene, Polyphenyleneoxide, Polyethylene, Polypropylene, divinyl-siloxane bis-benzocyclobutene (BCB), or $\alpha$C, this may offer an added advantage when a low k dielectric material is also be used to form the electrically insulating layer which is applied over the patterned metal layer.

VI. SPECIALIZED ETCH CHEMISTRY USEFUL IN COMBINATION WITH THE ETCH STACK

A second embodiment of the present invention pertains to a specialized etch chemistry useful in patterning silicon-free organic polymeric layers such as low k dielectrics and other organic interfacial layers. This etch chemistry is particularly useful when the conductive material in a multilayered etch stack is copper, or when copper is the conductive fill material used for formation of a contact via, or in a damascene or dual damascene process.

By way of explanation, in a damascene process, the process steps would typically include: blanket deposition of a dielectric material; patterning of the dielectric material to form openings; deposition of a diffusion barrier layer and, optionally, a wetting layer to line the openings; deposition of a conductive layer such as copper, tungsten, or aluminum onto the substrate in sufficient thickness to fill the openings; and removal of excessive conductive material from the substrate surface using chemical-mechanical polishing (CMP) techniques or etch-back techniques. The damascene process is described in detail by C. Steinbruchel in "Patterning of copper for multilevel metallization: reactive ion etching and chemical-mechanical polishing", *Applied Surface Science* 91 (1995) 139–146.

In particular, the etch chemistry of the present invention provides for use of etchant plasma species wherein the content of at least one etchant species selected from the group consisting of oxygen, fluorine, chlorine, and bromine is minimized. Preferably, when the conductive material is copper, essentially none of the plasma source gas material furnishes reactive species comprising oxygen, fluorine, chlorine, or bromine. Etchant species which contain oxygen, fluorine, chlorine or bromine leave deposits of etch byproduct which are chemically harmful to the copper structures which they contact, typically reducing the conductivity of such layers. Further, oxygen etchant species tend to have a detrimental effect on a typical contact via or trench wall etch profile.

When the conductive material is aluminum, tungsten, platinum, or iridium, rather than copper, the presence of oxygen is more acceptable during etch of the organic polymeric material, as previously mentioned. The effect of the presence of various halogens depends on the particular metal used. However, even when the conductive material is aluminum, tungsten, platinum, or iridium, oxygen-comprising or halogen etchant species are typically used as additives to increase etch rate or improve etch profile, but are not the principal etchant species for etching of the organic, polymeric material.

The preferred etch plasma of the present invention is a hydrogen/nitrogen-based plasma having principally hydrogen-comprising and/or nitrogen-comprising etchant species. In addition, as described above, depending on the materials used in the device fabrication, the concentration of at least one etchant species generated from a source comprising an element selected from the group consisting of oxygen, chlorine, fluorine, and bromine is minimized. To provide a hydrogen/nitrogen-based plasma, the plasma etchant species comprise principally hydrogen, or principally nitrogen, or principally a mixture thereof. To provide these species, the plasma source gas comprises at least one of the materials selected from the group consisting of hydrogen, nitrogen, ammonia and compounds thereof, hydrazine and compounds thereof, hydroazoic acid, and combinations thereof. When the conductive material to be used in the device is not copper, but is instead aluminum, tungsten, platinum, or iridium, the plasma source gas may comprise hydroxylamine or a compound thereof. The most preferred plasma source gas comprises ammonia; or hydrogen and nitrogen; or a combination of ammonia with hydrogen, nitrogen, or both.

Other gases which provide essentially non-reactive etchant species, such as argon, helium, neon, krypton, and xenon may be present in varying amounts, by way of example, and not by way of limitation.

In particular, when the organic, polymeric material being etched serves as a patterning mask for etch of a copper film, or when the organic, polymeric material being etched is part of a damascene structure which is to be filled with copper, the etch chemistry provides for use of etchant plasma species where the oxygen, fluorine, chlorine, and bromine content is minimized. Preferably, essentially none of the plasma source gas material furnishes reactive species comprising oxygen, fluorine, chlorine, or bromine. When a patterning mask for etch of a copper film is prepared, should these etchant species contact the copper film, the film is oxidized or otherwise corroded. In addition, etchant species which contain oxygen, fluorine, chlorine or bromine leave deposits of etch byproduct on etched contact via and damascene structure surfaces which may cause oxidation and corrosion of copper depositions made over such surfaces. Further, during etching of some organic-comprising materials, oxygen and fluorine etchant species tend to have a detrimental effect on a typical contact via or trench etch profile.

When the conductive material is aluminum, tungsten, platinum, or iridium, rather than copper, the presence of oxygen is more acceptable during etch of the organic polymeric material. When the metal fill layer is tungsten, platinum, or iridium, the effect of the presence of fluorine, chlorine and bromine depends on the particular material used, as is known to one skilled in the art. However, even when the conductive material is aluminum, tungsten, platinum or iridium, oxygen-comprising or halogen etchant species are typically used as additives to increase etch rate or improve etch profile, or to control residue on an etch surface, but are not the principal etchant species for etching of the organic, polymeric material.

FIG. 4A shows a schematic of a cross-sectional view of a test wafer comprising a series of etched contact vias 405 overlying an aluminum layer 408. (In a damascene process or a dual damascene process, aluminum layer 408 would be replaced by a series of lines or other multi-leveled interconnect structures.) Each contact via 405 is created through a multilayered etch stack structure 400, which includes, from top to bottom, a layer of silicon oxide patterned hard mask 402, and a layer of FLARE™ low k dielectric 404. Underlying the low k dielectric layer 404 is a layer of titanium nitride 406, and underlying the titanium nitride is a layer of aluminum 408. Due to the etch chemistry used to etch the via, the low k dielectric, a poly(arylene ether), is severely undercut beneath the patterned silicon oxide hard mask.

In detail, the multilayer etch stack included: A silicon dioxide layer (TEOS) 402 approximately 2,000 Å thick; and a FLARE™ 2.0 low k dielectric layer 404 (a polyarylene ether, available from Allied Signal, Advanced Microelectronic Materials, Sunnyvale, Calif.) approximately 8,000 Å thick. Underlying the low k dielectric layer 404 was an underlying titanium nitride layer 406 approximately 800 Å thick, and underlying that was an aluminum layer 408 approximately 5,000 Å thick. The feature size of the vias was about 0.3 μm and the aspect ratio was about 4:1 (including the silicon dioxide layer 402 and the low k dielectric layer 404). The etching processes were carried out in a CENTURA® Metal Etch Integrated Processing System including a decoupled plasma source (DPS), available from Applied Materials, Inc. of Santa Clara, Calif., under the following set of conditions, which generally provided a high density plasma.

The silicon dioxide layer was etched through a patterned 1 μm thick masking layer of DUV photoresist (which is not shown in FIG. 4A). The plasma source gas for etching silicon dioxide layer 402 was 100 sccm of argon, 60 sccm of $CHF_3$, and 20 sccm of $CF_4$. The Source Power was about 2,000 W at a frequency of about 2 MHZ; the Bias Power was about 600 W at a frequency of about 13.56 MHZ; the substrate support platen (cathode) temperature was about 30° C.; the helium pressure on the backside of the 200 mm wafer substrate was about 12 Torr; the process chamber pressure was about 10 mT; the chamber wall temperature was about 80° C.; and the etch time was about 30 seconds.

The FLARE™ 2.0 low k dielectric layer 404 was sequentially etched in the same process chamber using a plasma source gas of 60 sccm of oxygen. The Source Power was about 1200 W; the Bias Power was about 400 W; the substrate support platen temperature was about 30° C.; the helium backside pressure was about 7 Torr; the process chamber pressure was about 8 mT; the chamber wall temperature was about 80° C.; and the etch time was about 60 seconds.

Figure 4B:
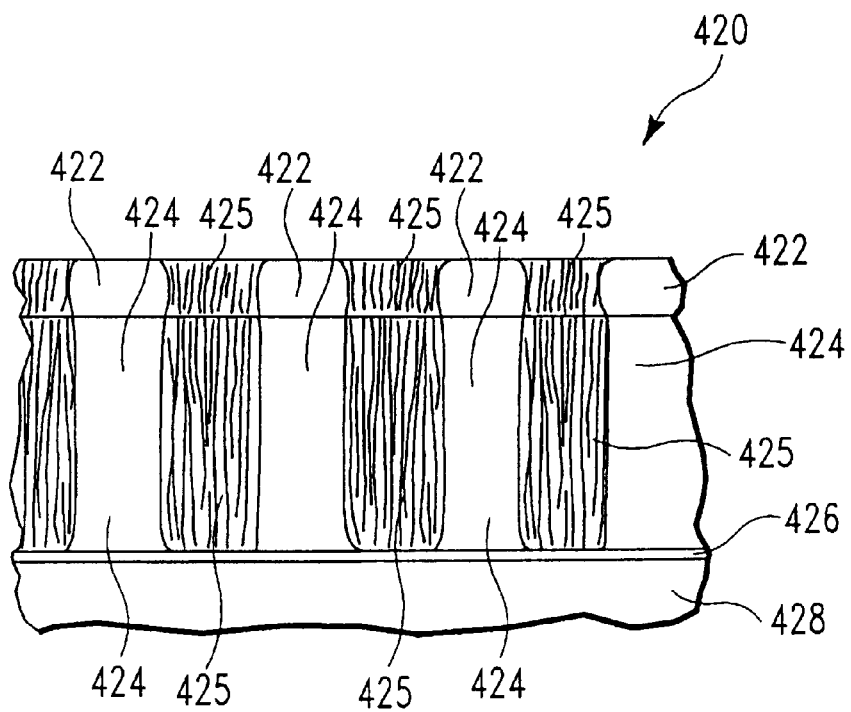
FIG. 4B shows a schematic of a cross-sectional view of the same etched contact vias shown in FIG. 4A, except that the etch chemistry of the present invention was used to provide nearly straight sidewalls on the etched via.

FIG. 4B shows a schematic of a cross-sectional view of the same series of etched contact vias shown in FIG. 4A, except that the etch chemistry of the present invention was used to provide nearly straight sidewalls on the etched via.

The silicon dioxide layer was etched through a patterned, 1 μm thick masking layer of DUV photoresist (which is not shown in FIG. 4B). The plasma source gas for the etching of silicon dioxide layer 422 was 100 sccm of argon, 60 sccm of $CHF_3$, and 20 sccm of $CF_4$. The Source Power was about 2,000 W; the Bias Power was about 600 W; the substrate support platen (cathode) temperature was about 5° C.; the helium pressure on the backside of the 200 mm wafer substrate was about 7 Torr; the process chamber pressure was about 10 mT; the chamber wall temperature was about 80° C.; and the etch time was about 30 seconds. Subsequent to this etch step, the etch processing chamber was dry-cleaned using an oxygen plasma, and seasoned by etching unpatterned photoresist in an ammonia ($NH_3$) plasma.

The FLARE™ 2.0 low k dielectric layer 404 was etched using a plasma source gas of 70 sccm of $NH_3$. The Source Power was about 1800 W; the Bias Power was about 300 W; the substrate support platen temperature was about 5° C.; the helium backside pressure was about 16 Torr; the process chamber pressure was about 8.5 mT; the chamber wall temperature was about 80° C.; and the etch time was about 140 seconds.

When an integrated series of etch steps is carried out in a single process chamber and an etch step produces a fluorine-comprising byproduct, it is advisable to dry clean the process chamber subsequent to that etch step and prior to proceeding to an etch step in which an organic polymeric material is etched. This is particularly important when the feature size of the pattern being etched is 0.25 μm or smaller.

In an additional experiment, all etch process conditions were the same as those which produced the straight sidewalls shown in FIG. 4B, but there was no dry cleaning of the etch process chamber between the etching of the silicon dioxide layer (using a fluorine-containing etchant species) and the etching of the low k dielectric layer. The etch profile was nearly the same as that shown in FIG. 4B, except that the upper surface of the silicon dioxide layer was attached and became faceted. Faceting refers to the corner edges of the hard mask being etched so that they become cut off and the mask opening becomes widened, resulting in a larger upper contact surface area. If the next layer of metal lines is slightly misaligned, this can result in shorting of metal lines in the device. An increased presence in the amount of fluorine byproduct resulted in increased faceting of the hard mask corners.

The etch chemistry described above can be used to etch other organic, polymeric layers, and especially low k dielectric materials such as SILK™, an organic polymer similar to BCB (divinylsiloxane bis-benzocyclobutene), which does not contain silicon, available from Dow Chemical Co., Midland, Mich.; FLARE 2.0™, a poly(arylene ether) available from Allied Signal Advanced Microelectronic Materials, Sunnyvale, Calif., which does not contain fluorine, despite its name. Although SILK™, and FLARE 2.0™ have been determined to work well, there are numerous other low k dielectric materials which are expected to behave in a similar manner when etched in accordance with the method of the present invention, using the etch chemistry described herein. Preferably these other low k dielectric materials do not include silicon or fluorine. Other non-fluorine-containing low k dielectrics include poly(arylene) ethers; Poly(arylene)ether oxazoles; Parylene-N; Polyimides; Polynapthalene-N; Polyphenyl-Quinoxalines (PPQ); Polybenzoxazoles; Polyindane; Polynorborene; Polystyrene; Polyphenyleneoxide; Polyethylene; Polypropylene; and similar materials.

A hydrocarbon-based plasma of the kind previously described can be used to etch organic polymeric layers in the manner described above. In one preferred embodiment, the principal plasma source gas is methane ($CH_4$). However, typically the methane is used in combination with ammonia, hydrogen, nitrogen, or a combination thereof. Chemically inert gases may be used as diluents. The volumetric flow rate of the source gas for the principal etchant species is in the range of about 50–100 sccm, with additive etchant species source gases, if any, being present in lesser amounts. Overall etch process variables are in the same ranges as those provided above for a hydrogen/nitrogen plasma in the CENTURA® METAL ETCH, DPS processing system.

In conclusion, the use of new (other than aluminum) conductive materials such as copper, platinum and iridium, in combination with high dielectric constant materials such as barium strontium titanate, and low dielectric constant materials such as FLARE® and SILK®, permits the continuing down scaling of integrated circuit devices and systems while providing improved performance. In addition use of such materials enables reduced power consumption as well as new device functionality. The methods of the present invention make it possible to take advantage of these new materials.

The above described preferred embodiments are not intended to limit the scope of the present invention, as one skilled in the art can, in view of the present disclosure expand such embodiments to correspond with the subject matter of the invention claimed below.

We claim:

1. A method for patterning semiconductor device features comprising the steps of:
   (a) transferring a pattern from a patterned photoresist layer through a layer of high-temperature inorganic masking material;
   (b) transferring the pattern from a multi-layered structure remaining after step (a) through an underlying layer of a high-temperature organic-based masking material;
   (c) removing any photoresist material which remains after step (b); and
   (d) transferring the pattern from the multi-layered structure present after step (c) through at least one metal-comprising feature layer underlying said high-temperature organic-based masking material, wherein at least one layer of said metal-comprising feature layers comprises platinum.

2. The method of claim 1, wherein said high-temperature organic-based masking layer is a low k dielectric material.

3. The method of claim 2, wherein said low k dielectric material is selected from the group consisting of Poly (arylene)ethers, Poly(arylene)ether oxazoles, Parylene-N, Polyimides, Polynaphthalene-N, Polyphenyl-Quinoxalines, Polybenzoxazoles, Polyindane, Polynorborene, Polystyrene, Polyphenyleneoxide, Polyethylene, Polypropylene, αC and combinations thereof.

4. A method for patterning semiconductor device features comprising the steps of:
   (a) transferring a pattern from a patterned photoresist layer through a layer of high-temperature inorganic masking material;
   (b) transferring the pattern from a multi-layered structure remaining after step (a) through an underlying layer of a high-temperature organic-based masking material;
   (c) removing any photoresist material which remains after step (b); and
   (d) transferring the pattern from the multi-layered structure present after step (c) through at least one metal-comprising feature layer underlying said high-temperature organic-based masking material, wherein said at least one metal-comprising feature layer comprises a metal selected from the group consisting of copper, platinum, silver, gold, iridium, rubidium, ruthenium, tungsten, and barium strontium titanate, and, wherein said at least one metal-comprising feature layer is etched using a combination of enhanced physical bombardment with a chemically reactive ion component.

5. The method of claim 4, wherein said at least one metal-comprising feature layer comprises platinum.

6. A method for patterning semiconductor device features comprising the steps of:
   (a) transferring a pattern from a patterned photoresist layer through a layer of high-temperature inorganic masking material;
   (b) transferring the pattern from a multi-layered structure remaining after step (a) through an underlying layer of a high-temperature organic-based masking material;
   (c) removing any photoresist material which remains after step (b); and
   (d) transferring the pattern from the multi-layered structure present after step (c) through at least one metal-comprising feature layer underlying said high-temperature organic-based masking material, wherein at least one layer of said metal comprising feature layers comprises aluminum.

7. A method for patterning semiconductor device features comprising the steps of:
   (a) developing an imaged layer of high-temperature imageable material into a pattern using a plasma etching technique, to produce a patterned mask which can be used to transfer a desired pattern through underlying layers;
   (b) transferring the pattern formed in step a) through an underlying layer of high-temperature organic-based masking material;
   (c) transferring the pattern from the multi-layered structure present after step (b) through at least one metal-comprising feature layer underlying said high-temperature organic-based masking material;

(d) removing residual high-temperature organic-based masking layer material from a surface of said feature layer; and (e) applying a planarizing layer of an organic-based material having a dielectric constant which is advantageous for purposes of increasing the gate speed of a transistor, wherein said organic-based material having an advantageous dielectric layer comprises a material selected from the group consisting of Poly(arylene) ethers, Poly(arylene)ether oxazoles, Parylene-N, Polyimides, Polynaphthalene-N, Polyphenyl-Quinoxalines, Polybenzoxazoles, Polyindane, Polynorborene, Polystyrene, Polyphenyleneoxide, Polyethylene, Polypropylene, αC, and combinations thereof.

8. A method for patterning semiconductor device features comprising the steps of:

(a) developing an imaged layer of high-temperature imageable material into a pattern using a plasma etching technique, to produce a patterned mask which can be used to transfer a desired pattern through underlying layers;

(b) transferring the pattern formed in step a) through an underlying layer of high-temperature organic-based masking material; and (c) transferring the pattern from the multi-layered structure present after step (b) through at least one metal-comprising feature layer underlying said high-temperature organic-based masking material, wherein at least one metal-comprising feature layer comprises platinum.

9. A method for patterning semiconductor features comprising the steps of:

(a) developing an imaged layer of high-temperature imageable material into a pattern using a plasma etching technique, to produce a patterned mask which can be used to transfer a desired pattern through underlying layers;

(b) transferring the pattern formed in step a) through an underlying layer of high-temperature organic-based masking material; and (c) transferring the pattern from the multi-layered structure present after step (b) through at least one metal-comprising feature layer underlying said high-temperature organic-based masking material, wherein at least one metal-comprising feature layer comprises aluminum.

* * * * *